United States Patent [19]

Potthast et al.

[11] Patent Number: 5,202,634
[45] Date of Patent: Apr. 13, 1993

[54] DOUBLE SURFACE COIL FOR A NUCLEAR MAGNETIC RESONANCE APPARATUS

[75] Inventors: Andreas Potthast, Erlangen; Guenther Decke, Hemhofen; Hermann Requardt, Erlangen, all of Fed. Rep. of Germany

[73] Assignee: Siemens Aktiengesellschaft, Munich, Fed. Rep. of Germany

[21] Appl. No.: 763,641

[22] Filed: Sep. 23, 1991

[30] Foreign Application Priority Data

Sep. 29, 1990 [DE] Fed. Rep. of Germany ....... 4030877

[51] Int. Cl.⁵ .......................................... G01R 33/20
[52] U.S. Cl. ..................................... 324/322; 324/318
[58] Field of Search ............... 324/300, 307, 309, 318, 324/322; 128/653.5

[56] References Cited

U.S. PATENT DOCUMENTS

| | | | |
|---|---|---|---|
| 4,717,881 | 1/1988 | Flugan | 324/322 |
| 4,733,190 | 4/1988 | Dembinski | 324/318 |
| 4,763,076 | 8/1988 | Arakawa et al. | 324/322 |
| 4,782,298 | 11/1988 | Arakawa et al. | 324/322 |
| 4,810,968 | 3/1989 | Van Heelsbergen | 324/322 |
| 4,839,594 | 6/1989 | Misic et al. | 324/318 |
| 4,881,034 | 11/1989 | Kaufman et al. | 324/318 |
| 4,924,868 | 5/1990 | Krause et al. | 128/653 |
| 5,030,915 | 7/1991 | Boskamp et al. | 324/318 |
| 5,049,821 | 9/1991 | Duensing et al. | 324/322 |
| 5,075,624 | 12/1991 | Bezjak | 324/318 |
| 5,097,210 | 3/1992 | Requardt et al. | 324/318 |

FOREIGN PATENT DOCUMENTS

| | | |
|---|---|---|
| 0176353 | 4/1986 | European Pat. Off. . |
| 0276508 | 8/1988 | European Pat. Off. . |
| 0335512 | 10/1989 | European Pat. Off. . |
| 3427666 | 7/1985 | Fed. Rep. of Germany . |
| 3500456 | 7/1985 | Fed. Rep. of Germany . |
| 3905564 | 9/1990 | Fed. Rep. of Germany . |

Primary Examiner—Michael J. Tokar
Attorney, Agent, or Firm—Hill, Steadman & Simpson

[57] ABSTRACT

A double surface coil for a nuclear magnetic resonance apparatus has two individual coils which are connectable to a transmission/reception circuit via a matching network. The coils are connected together at a junction. Each coil has a controllable switch connected between the junction and the matching circuit. The individual surface coils can thus be controlled with a low number of controlled elements in any desired operating mode.

9 Claims, 4 Drawing Sheets

DOUBLE SURFACE COIL FOR A NUCLEAR MAGNETIC RESONANCE APPARATUS

BACKGROUND OF THE INVENTION

1. Field of the Invention

The present invention is directed to a double surface coil for a nuclear magnetic resonance apparatus, of the type wherein two individual coils can be optionally connected via a matching network to a transmission/reception circuit, the individual coils having a common junction.

2. Description of the Prior Art

Surface coils are used in magnetic resonance imaging (MRI, or nuclear magnetic resonance imaging, NMR) tomography systems, and in systems for spectroscopic analysis, in which specific parts of an examination subject are to be evaluated with an improved signal-to-noise ratio. Transmission is generally undertaken using a whole-body antenna, and reception is undertaken with the surface coil. A surface coil is disclosed, for example, in European Application 0 280 908, corresponding to U.S. Pat. No. 4,924,868, wherein a double surface coil which is divided into a plurality of separately activatable individual coils, which can be selectively connected to the transmission/reception circuit.

The optimum signal-to-noise ratio is obtained if the surface coil is designed so that its reception range just covers the region of interest of the examination subject. It is preferable for this purpose in specific application to be able to switch the reception range of the surface coil. To this end, the surface coil disclosed in European Application 0 280 908 is in the form of a ladder-shaped structure, by means of which the effective area of the surface coil, as well as the position of the examination region, can be varied. This arrangement is particularly suitable for spinal column diagnostics, because different regions of the spinal column can be successively examined without mechanically displacing the surface coil, by electrically switching the position of the effective area.

Double surface coils are adequate in some applications to achieve the desired three-dimensional selectivity. Such coils are adequate, for example, for mammography, wherein it is desirable to be able optionally image the breasts individually or together. Switching in coil disclosed in the aforementioned European Application 0 280 908 is undertaken by means of varactor diodes, each of which requires a control signal, and the structure also exhibits a high stray capacitance. The structure of European Application 0 280 908 is thus too complicated for use in such double surface coils.

SUMMARY OF THE INVENTION

It is an object of the present invention to provide a double surface coil circuit which is optimally suited, and is simple to operate, under the examination conditions which normally make the use of a double surface coil desirable.

The above object is achieved in accordance with the principles of the present invention in a double surface coil having individual coils connected at a common junction, each coil having a controllable switch connected between the junction and respective terminals which are connectable to the matching circuit.

In comparison to known surface coils, the structure in accordance with the present invention has a lower number of PIN diodes and control signals.

Each coil may also have a second controllable switch connected between the common junction and the aforementioned terminal which is connected to the matching circuit. The second controllable switch in each coil will be open as long as the allocated individual coil is not in a reception mode. A decoupling of the individual coil which is not being used is thus achieved.

The controllable switches are preferably pin diodes, with each PIN diode having a blocking capacitor connected in series with it, and each PIN diode being supplied with a control voltage via an inductor.

The second switch may be a PIN diode whose switching effect is inverted by a quarter-wave element, in which case only two control voltages for all of the switches are needed.

DESCRIPTION OF THE PREFERRED EMBODIMENTS

Figure 1:
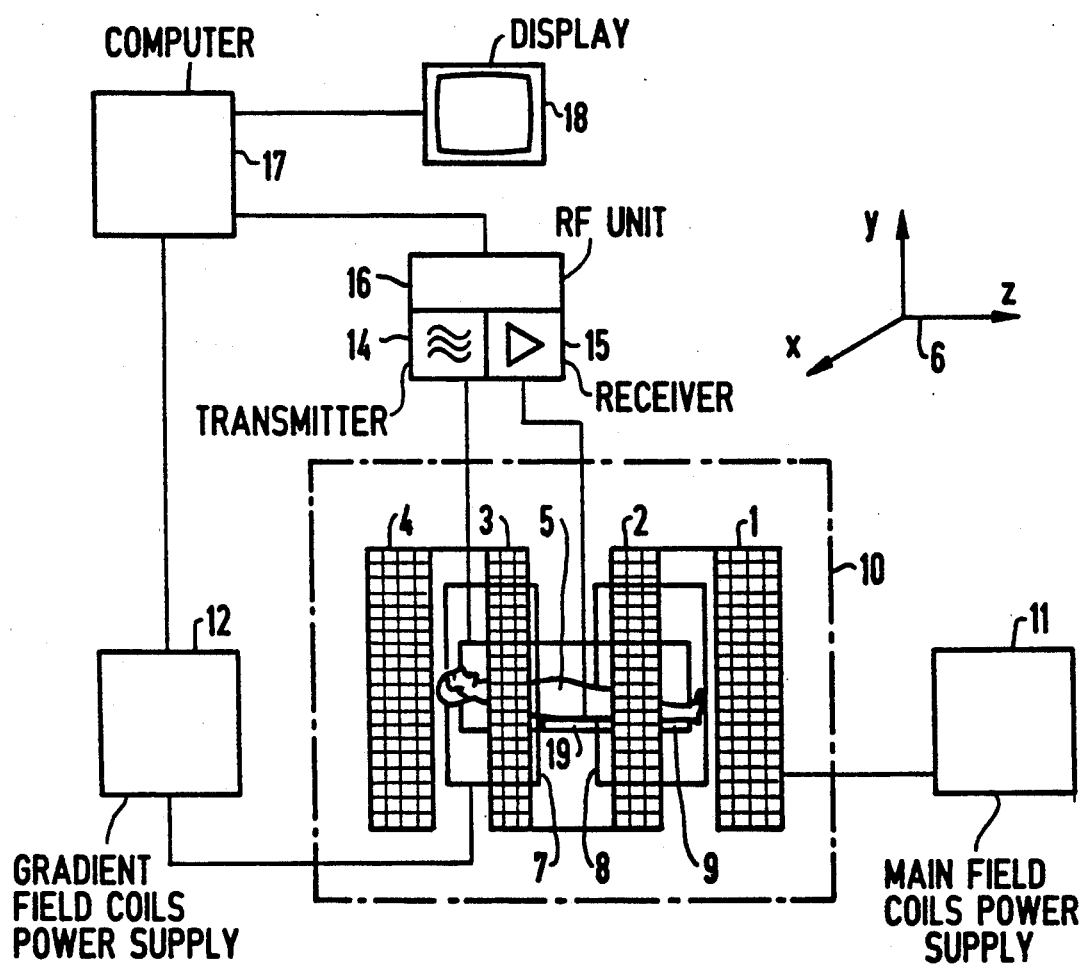
FIG. 1 is a schematic block diagram of a typical magnetic resonance imaging apparatus, in which the double surface coil constructed in accordance with the principles of the present invention can be used.

The basic components of a typical magnetic resonance imaging apparatus are shown in FIG. 1, the apparatus also being usable for spectroscopic examination of a subject. In the apparatus shown in FIG. 1, coils 1, 2, 3 and 4 generate a main magnetic field in which the body 5 of an examination subject is situated, given a medical application. Gradient coils are also provided for generating independant, orthogonal magnetic field gradients in the x, y and z-directions of a rectangular coordinate system 6. For clarity, only the gradient coils 7 and 8 are shown in FIG. 1, which generate a gradient field in the x-direction in combination with a pair of identical coils opposite thereto (not shown). Pairs of gradient coils (not shown) for generating a gradient field in y-direction are disposed parallel to, above and below, the body 5. A pair of gradient coils (not shown) for generating a gradient field in z-direction are disposed transversely to the longitudinal axis of the body 5 at the feet and head thereof. The apparatus also includes a body resonator 9 in the form of an antenna, which serves to excite nuclear magnetic resonance signals in the body 5. A surface coil 19 is provided for picking up the resulting nuclear magnetic resonance signals. The surface coil 19 may also be used to generate the nuclear magnetic resonance signals instead using the body resonator 9.

The actual examination instrument is formed by the coils 1, 2, 3, 4, 7 and 8 surrounded by the dot-dashed line 10, as well as the body resonator 9 and the surface coil 19. A main field coils power supply 11 is provided for operating the coils 1 through 4. The gradient coils 7 and 8, and the further gradient coils which are not shown in the drawing are connected to a gradient fields power supply 12. A high-frequency transmitter 14, controlled by a process control computer 17 is connected to the body resonator 9. The surface coil 19 is also connected to the computer 17 via a signal amplifier 15, The components 14 and 15 form a high-frequency transmission/reception circuit 16 for signal generation and signal pick-up. The computer 17 also controls operation of the gradient fields power supply 12, so that signals are obtained in a known manner from which a visual image of a selected slice of the examination subject, or spectroscopic information concerning body constituents, can be portrayed on a display 18.

Figure 2:
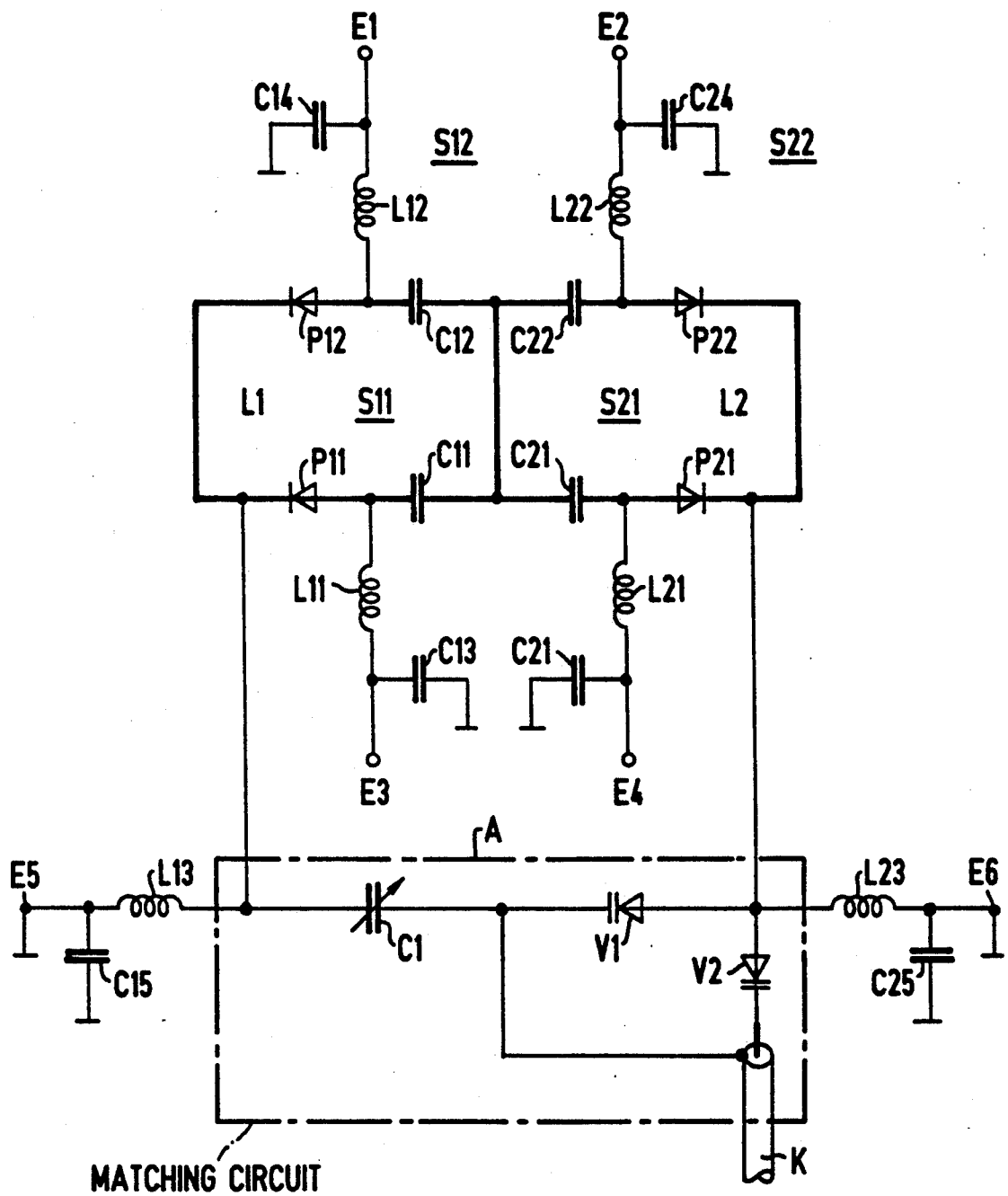
FIG. 2 is a circuit diagram of a double surface coil constructed in accordance with the principles of the present invention, connected to a matching circuit.

A first exemplary embodiment of a double surface coil constructed in accordance with the principles of the present invention is shown in FIG. 2. The double surface coil of FIG. 2 is formed by two conductor loops L1 and L2, having a common connecting branch or web St. Such a double surface coil, for example, is usable to advantage in mammography, or as a coil for examining a knee, or a coil for examining a spinal column, whereby the shape of the conductor loops L1 and L2 will be adapeted to the particular application.

Each conductor loop L1 and L2 in the exemplary embodiment of FIG. 2 has two controllable switches, switches S11 and S12 being connected in the loop L1 and switches S21 and S22 being connected in the loop L2. The first controllable switches S11 and S21 are connected to the connecting branch St. The respective terminals of the switches S11 and S21 facing away from the connecting branch St are connected to a matching circuit A. At its input side, the matching circuit A contains a series circuit formed by a variable capacitor C1 and a first varactor diode V1. Additionally, one input is connected via a second varactor diode V2 to the inner conductor of a coaxial line K, which leads to the transmission/reception unit 16 of FIG. 1. The junction between the capacitor C1 and the varactor diode V1 is connected to the outer conductor of the coaxial cable K, and is thus at grounded potential.

The individual coils L1 and L2 can be balanced with respect to the ground potential by means of the capacitor C1. An impendance matching of the surface coil is undertaken with the varactor diodes V1 and V2. The impedance can also be matched to changing load conditions at the surface coil using control voltages, not shown in FIG. 2 for clarity.

The second switches S1 and S2 are respectively connected in series in the loops L1 and L2.

In the exemplary embodiment, each switch S11, S12, S21, S22 includes, as a switching element, a PIN diode P11 P12, P21 and P22 with a respective capacitor C11, C12, C21, C22 connected thereto in series. A control current or a blocking voltage is supplied to the junction of each PIN diode and its capacitor via respective control inputs E1, E2, E3 and E4 and via respective inductors L11, L12, L21 and L22. The inductors L11, L12, L21 and L22 prevent a high-frequency current from flowing to the control means. Further, the control inputs E1 through E4 are respectively connected to reference potential via blocking capacitors C13, C14, C21 and C24, so that remaining high-frequency currents can be eliminated by shunting those currents to d.c. voltage reference potential.

The drive of PIN diodes is described, for example, in the text by Kesel et al. entitled "Signalverarbeitende Dioden," 1982, pages 54–56.

The d.c. control signals supplied to the PIN diodes P11, P12, P21 and P22 are connected to the d.c. reference potential $DC_0$ via respective inductors L13 and L23 and respective control inputs E5 and E6. The inductors L13 and L23 are connected to the terminal for the matching circuit A. Capacitors C15 and C25 are again provided for shorting high-frequency components which may remain following the inductors L13 and L23.

Figure 3:
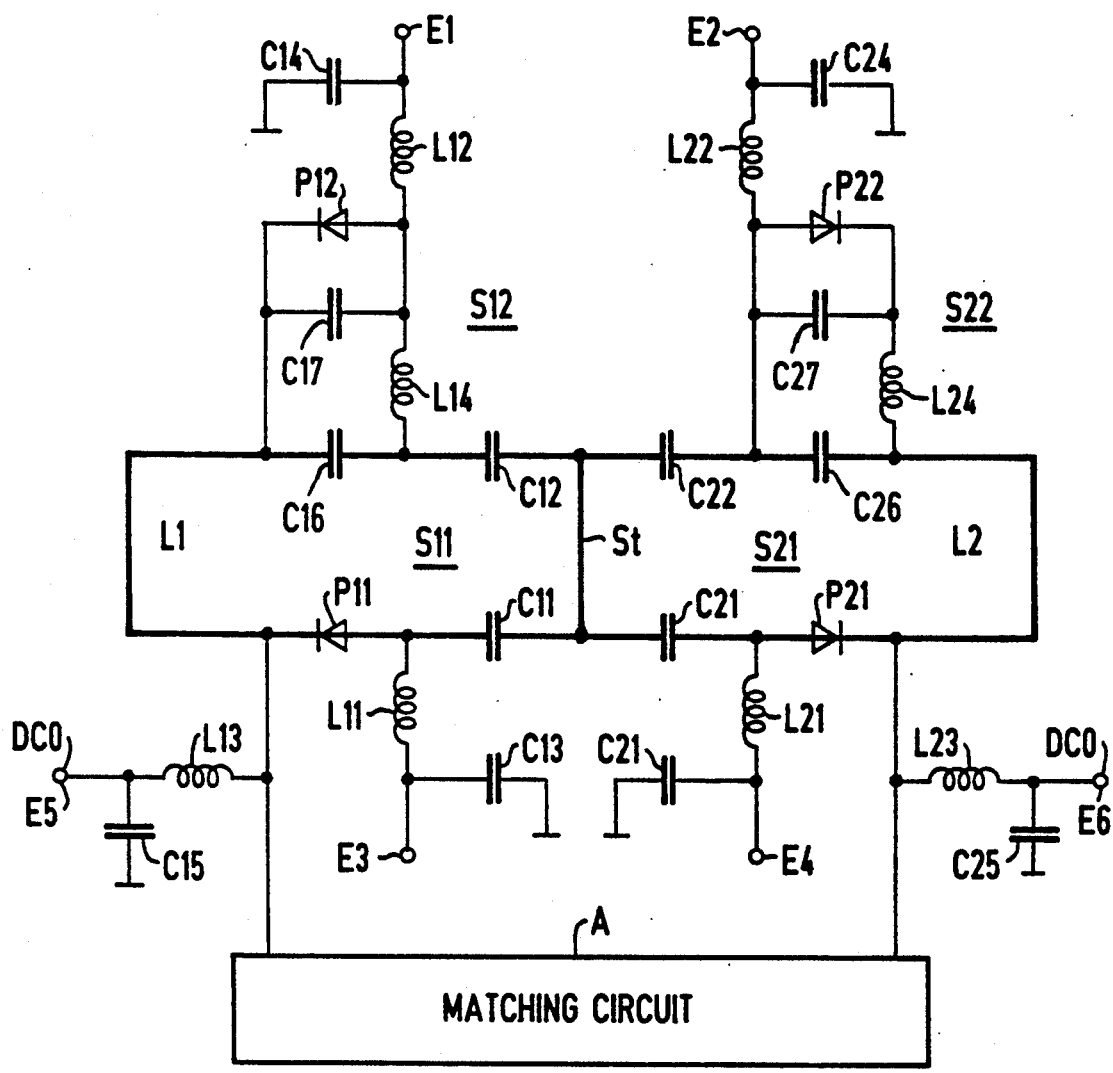
FIG. 3 is a circuit diagram of a further embodiment of a double surface coil constructed in accordance with the principles of the present invention, connected to a matching circuit.

In the illustrated embodiment of FIG. 3, the individual loop (coil) L1, the individual loop (coil) L2, or both loops (coils) can be optionally activated. If, for example, the individual coil L1 is to be activated, the PIN diode P21 is switched to a transmitting state via the inductor L21, whereas the PIN diode P11 remains inhibited, by an inhibit voltage applied via the inductor L11. The capacitor C21 prevents the control current for the PIN diode P21 from unintentionally flowing away, however it is dimensioned so that it represents a low impedance for high-frequency. During the reception mode of the individual coil L1, the PIN diode P12 is switched to a transmitting state via the inductor L12, the capacitor C12 again preventing outflow of the control current. During the reception mode, the individual coil L1 is thus connected to the matching circuit A, and thus to the transmission/reception unit 16 via the coaxial cable K. At the same time, the PIN diode P22 is inhibited by an inhibit voltage via the inductor L22, so that the individual coil L2 is interrupted. During the transmission mode of the whole-body antenna 9, the PIN diodes P12 and P22 are switched to an inhibited condition by an inhibit voltage, so that the entire surface coil 19 is decoupled from the whole-body antenna 9.

If the individual coil L2 is to be activated, the PIN diode P11, at least in the reception mode, is switched to a transmitting state and, only during the reception mode, the PIN diode P22 is switched to the transmitting state, so that the individual coil L2 is now connected to the matching circuit A. The PIN diodes P12 and P21 remain inhibited.

Finally, it is also possible to activate both individual coils L1 and L2 simultaneously by, during the transmission mode, switching the PIN diodes P12 and P22 to a transmitting state, whereas the PIN diodes P11 and P21 remain inhibited.

A simplification of the drive is shown in the embodiment of FIG. 2, wherein the switches S12 and S22 are constructed as shown. The switching effect of the PIN diodes P12 and P22 is thus inverted by a quarter-wave element inserted into the circuitry. For this purpose, capacitor C16 and C26 are respectively connected in the circuitry of the individual coils L1 and L2. This capacitor C16 is bridged by the series circuit of an inductor L14 and a capacitor C17, and the capacitor C26 is bridged by the series circuit of an inductor L24 and a capacitor C27. The PIN diode P12 is connected in parallel with the capacitor C17 and the PIN diode P22 is connected in parallel with the capacitor 27. Otherwise, the circuit of FIG. 3 corresponds to that of FIG. 2.

The capacitors C16 and C17 and the inductor L14, and the capacitors C26 and C27 and the inductor L24, are dimensioned so that, dependent on the switching status of the PIN diodes P12 and P22, a parallel resonant circuit or a series resonant circuit tuned to the operating frequency of the magnetic resonance imaging apparatus results.

If, for example, the PIN diode P12 (or P22) is switched to a transmitting state, the capacitor C17 (or C27) connected in parallel therewith is bridged, and the inductor L14 (or L24) in combination with the capacitor C16 (or C26) forms a parallel resonant circuit having high impedance. Given a conductive PIN diode P12 (or P22) the allocated individual coil L1 or L2 is thus interrupted in terms of high-frequency. If, conversely, the PIN diode P12 (or P22) is charged with an inhibit voltage, the inductor L14 (or L24) in combination with the capacitor C17 (or C27) forms a series resonant circuit which has a low impedance at resonance. Given an inhibited PIN diode 12 (or P22), therefore, the associated individual coil is thus no longer interrupted.

Figure 4A:
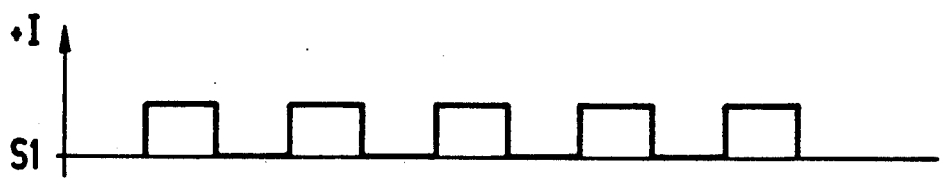
FIGS. 4a, 4b show a dynamic control voltage signal for use in operating either of the double surface coils in FIGS. 2 or 3.
Figure 4B:
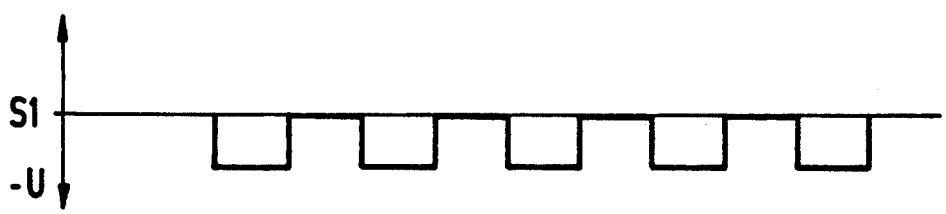

The drive of the PIN diodes P12 and P22 thus ensues inversely to the drive of these PIN diodes set forth in conjunction with FIG. 2. Moreover, only two control signals are required in the embodiment of FIG. 3. A first control signal S1, shown in FIGS. 4a, 4b is dynamic (i.e., time varying) and alternates in polarity in accord with the excitation sequence for the nuclear magnetic resonance signals. The signal S1 alternates between a negative inhibit voltage $-U$ (FIG. 4b) and a control current $+I$ (FIG. 4a) in the conducting direction for the PIN diodes.

Figure 5:
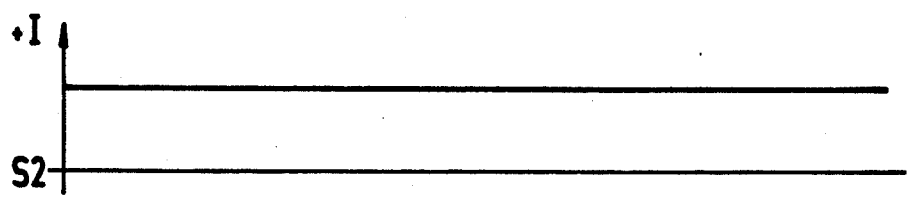
FIG. 5 shows a static control signal for operating the double surface coils of either FIGS. 2 or 3.

A second control signal S2 is shown in FIG. 5, which is static and is formed, for example, by a chronologically constant control current $+I$.

One of the aforementioned operating states is selected dependent on how the two control signals S1 and S2 are supplied to the control inputs E1 through E4. If, for example the individual coil L1 is to be driven, the static signal S22 is connected to the control inputs E2 and E4, and the dynamic signal S1 is connected to the control inputs E3 and E1. For operation of the individual coil L2, the signals are transposed, i.e., the static signal S2 is applied to the inputs E1 and E3 and the dynamic signal S1 is applied to the inputs E2 and E4. For dual operation of both coils L1 and L2, the dynamic signal S1 is applied to all inputs E1 through E4.

The illustrated arrangement is thus distinguished by a low control outlay, because since only two control signals S1 and S2 are required.

A good uniformity is achieved by the operation of both individual coils L1 and L2, since no high-frequency current will then be flowing in the connecting branch St.

Although modifications and changes may be suggested by those skilled in the art, it is the intention of the inventors to embody within the patent warranted hereon all changes and modifications as reasonably and properly come within the scope of their contribution to the art.

We claim as our invention:

1. A double surface coil for use in a nuclear magnetic resonance apparatus having a transmission/reception circuit with a matching network connected thereto, said double surface coil comprising:
   first and second individual coils having a common junction, each individual coil having a terminal connectable to said matching network; and
   each coil having a controllable switch connected between said common junction and said terminal, said controllable switches being operable in combination for selectively connecting one or both of said individual coils to said matching circuit.

2. A double surface coil as claimed in claim 1 wherein each of said individual coils includes a further controllable switch connected between said common junction and said terminal, said second controllable switch being open as long as the associated individual coil is not in a reception mode.

3. A double surface coil as claimed in claim 1 wherein said controllable switches and said further controllable switches are each formed by a PIN diode, each PIN diode having a blocking capacitor connected in series therewith, and each PIN diode being connected to a respective control voltage input via an inductor.

4. A double surface coil as claimed in claim 3 wherein each of said further controllable switches includes means for inverting the switching effect of the further controllable switch by a quarter-wave.

5. A double surface coil as claimed in claim 3 wherein said PIN diodes are supplied with a control voltage having a reference potential associated therewith, and wherein said double surface coil further comprises respective inductors connecting said terminals of said individual coils to said reference potential.

6. A double surface coil as claimed in claim 1 wherein said individual coils are disposed side-by-side for mammography.

7. A double surface coil as claimed in claim 1 wherein said common junction is a connecting branch.

8. A double surface coil as claimed in claim 1 wherein said controllable switches are each formed by a PIN diode, with each PIN diode having a blocking capacitor connected in series therewith, and each PIN diode having a respective control voltage input connected to an inductor.

9. A double surface coil as claimed in claim 8 wherein said control voltage for said PIN diodes has a reference potential associated therewith, and wherein said double surface coil further comprises respective inductors connecting said terminals of said individual coils to said reference potential.

* * * * *